(12) United States Patent
Camera et al.

(10) Patent No.: US 6,772,379 B1
(45) Date of Patent: Aug. 3, 2004

(54) APPARATUS FOR VERIFYING THE DATA RETENTION IN NON-VOLATILE MEMORIES

(75) Inventors: Alessandro Camera, Savona (IT); Ignazio Bellomo, Ponte Sesto Rozzano (IT); Paolo Sandri, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 286 days.

(21) Appl. No.: 09/710,089

(22) Filed: Nov. 10, 2000

(30) Foreign Application Priority Data

Nov. 11, 1999 (IT) .......................................... MI99A2361

(51) Int. Cl.[7] .............................................. G11C 29/00
(52) U.S. Cl. ...................................... 714/721; 714/719
(58) Field of Search ................................ 714/719, 718, 714/733, 729, 30, 721; 711/106; 365/238.5, 185, 145

(56) References Cited

U.S. PATENT DOCUMENTS

| | | | | |
|---|---|---|---|---|
| 5,146,431 A | * | 9/1992 | Eby et al. ................. 365/238.5 |
| 5,153,853 A | * | 10/1992 | Eby et al. .................... 365/185 |
| 5,258,986 A | * | 11/1993 | Zerbe .......................... 714/719 |
| 5,325,367 A | * | 6/1994 | Dekker et al. ............. 714/718 |
| 5,331,188 A | * | 7/1994 | Acovic et al. .............. 257/298 |
| 5,553,082 A | * | 9/1996 | Connor et al. ............. 714/733 |
| 5,592,493 A | * | 1/1997 | Crouch et al. ............. 714/729 |
| 5,617,531 A | * | 4/1997 | Crouch et al. ............... 714/30 |
| 5,726,930 A | * | 3/1998 | Hasegawa et al. .......... 365/145 |
| 5,764,655 A | * | 6/1998 | Kirihata et al. ............ 714/733 |
| 5,768,182 A | * | 6/1998 | Hu et al. ..................... 365/145 |
| 6,034,884 A | * | 3/2000 | Jung .......................... 365/145 |
| 6,272,588 B1 | * | 8/2001 | Johnston et al. ........... 711/106 |
| 6,496,947 B1 | * | 12/2002 | Schwarz ..................... 714/30 |

* cited by examiner

Primary Examiner—David Ton
(74) Attorney, Agent, or Firm—Lisa K. Jorgenson; David V. Carlson; SEED IP Law Group PLLC

(57) ABSTRACT

An apparatus for verifying the data retention in a non-volatile memory is described which comprises at least one multiplexer and at least one shift register. The multiplexer and the at least one shift register are disposed so that the data of the non-volatile memory are in input to the multiplexer the output of which is in turn in input to the at least one shift register. The apparatus comprises a logical circuitry which by suitable commands controls the data transfer from said multiplexer to said at least one shift register, the data loading and the output data shifting in said at least one shift register.

27 Claims, 3 Drawing Sheets

US 6,772,379 B1

APPARATUS FOR VERIFYING THE DATA RETENTION IN NON-VOLATILE MEMORIES

TECHNICAL FIELD

The present invention relates to an apparatus for verifying the data retention in non-volatile memories, particularly in EPROM memories. More particularly such invention relates to an apparatus for verifying the data retention in EPROM memories in an integrated circuit.

BACKGROUND OF THE INVENTION

In the manufacturing of integrated circuits it is possible to incur in the manufacturing of non-volatile memory cells which can show defects in data storage and which can carry to the failure of a device wherein they are comprised. Also the memory cells must be tested in order to detect the defective cells which will be eliminated.

In the case wherein a non-volatile memory is used in an integrated circuit, it is necessary to have a circuitry in order to effectuate the data retention tests in each single memory cell. Such operations must consider the possibility to effectuate thermal stress simulations to which a device containing the non-volatile memory will be subjected after the assemblage on the final chip.

The circuitry which must be performed to satisfy such needs must be as little bulky as possible and it must increase as little as possible the time to effectuate such test.

A latch matrix, per se, used for block 12 is of a type well known in the art and thus the details need not be described.

SUMMARY OF THE INVENTION

According to the present invention, an apparatus for verifying the data retention in a non-volatile memory comprising at least one multiplexer and at least one shift register, is provided. The multiplexer and shift register are disposed so that the data of the non-volatile memory are input to the multiplexer. The output of the multiplexer is in turn input to the shift register. A logical circuit using suitable commands controls the transfer of data from the multiplexer to the shift register, the loading of data and the shifting of output data from the shift register.

Thanks to the present invention, it is possible to provide an apparatus for verifying the data retention in non-volatile memories which is small in size, which is fast and which provides the assurance of the reliability of the memory cells.

BRIEF DESCRIPTION OF THE DRAWINGS

The features and the advantages of the present invention will be made evident by the following detailed description of one particular embodiment thereof, illustrated as not limiting example in the annexed drawings, wherein.

DETAILED DESCRIPTION OF THE INVENTION

Figure 1:
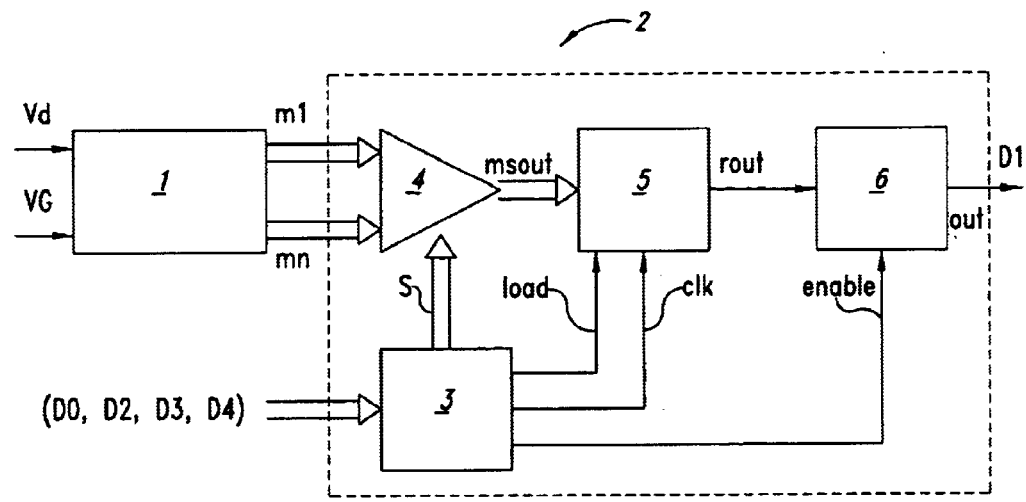
FIG. 1 is a block diagram showing a memory and the verify apparatus according to invention.

In FIG. 1 a block diagram of a memory 1 connected to a verify apparatus 2 according to present invention is shown which is implemented in the same chip where the memory 1 is present. The apparatus 2 is formed by four blocks, a logic block 3, a multiplexer 4, a parallel input and serial output register (PISO) 5, and a buffer 6 which are suitably connected to each other.

The block 3 is the manager of the system logic and it has four digital inputs given from the outside at the pins D0, D2, D3, D4, and three output signals called load, clk, enable. The load and clk signals for controlling the block 5 while enable is the control signal of the block 6. It also outputs an i bit output vector S which is the selector of the block 4.

The multiplexer 4 has the task to conduct a word, formed by m bits, one at a time from the memory 1 to the register 5 according to the selector S. The memory comprises non-volatile memory cells disposed by rows and columns in a matrix structure, wherein the number of the matrix words or rows which are stored in the memory 1 is n=$2^i$. Each word m1, . . . mn of the memory 1 is input to the block 4, the output word of which is indicated with msout. The memory matrix may be an EPROM, EEPROM, flash or other non-volatile memory cell array and will thus be referred to as a memory matrix.

The register 5 must load the word msout at its input and it furnishes in output in the signal rout the word bit-for-bit starting from the most significant bit, MSB, to the least significant bit, LSB. The logic block 3 causes the loading of the word msout in the register 5 in a certain time by the load signal, while it causes the shifting of the loaded word by the clk signal.

The buffer 6 is a three-stage buffer which has the duplex function to disconnect the output rout of the register 5 from a pin D1 connected to the output to the buffer 6, so that such pin D1 can be utilized differently than in the typical operation of a device comprising both the memory 1 and the apparatus 2, namely, so it can output a voltage signal, for example ranging from 0V to 5V, which can be utilized as input signal for a suitable test or measurement instrument. Such buffer 6 is enabled by the enable signal coming from the block 3.

Figure 2:
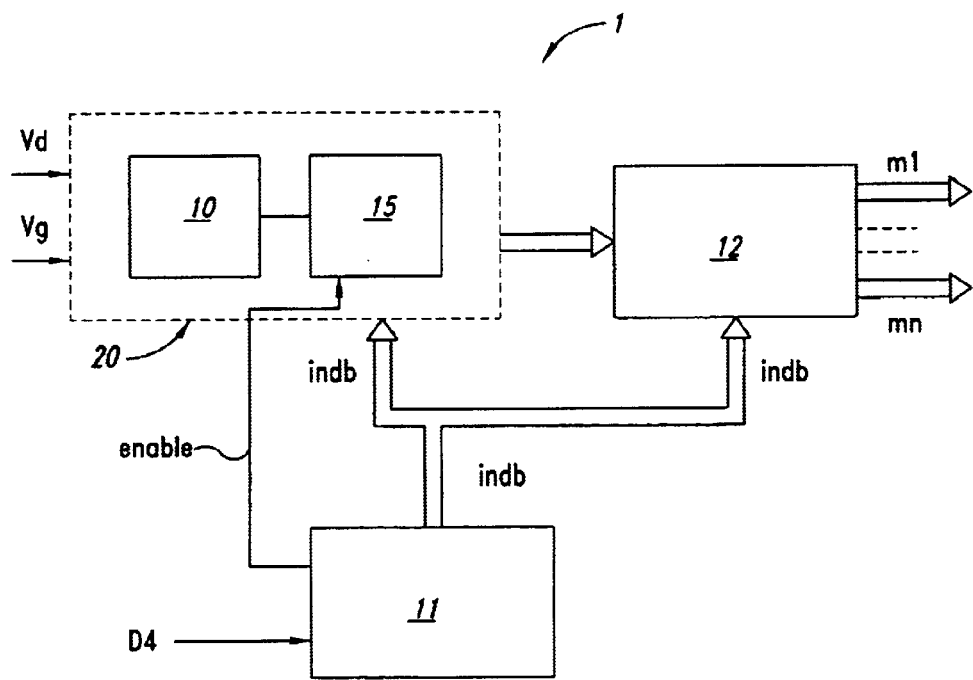
FIG. 2 is a more detailed block diagram of the memory of FIG. 1.

The memory 1 comprises blocks 20, 11 and 12, as shown in FIG. 2. The block 20 comprises the block 10 formed by a non-volatile memory having memory cells organized by n rows (word-lines) and m columns (bit-lines), and a block 15 comprising m sense amplifiers. The voltages are supplied from outside to the drain and gate terminals of the cells of the memory 10 with respective input signals vd and vg, and b bit address signals indb which allow a row addressing of the memory matrix. The reading of the columns is effectuated in parallel by the m sense amplifiers 15, which are current comparators which by comparing the current passing through a memory cell with the current passing through a reference cell understand when a cell is written or not. In one embodiment, if a memory cell has been written to, it will pass a current much lower than that of the reference cell because such cell will have a higher voltage threshold due to the charge stored in the insulated gate after writing. The block 20 also comprises a plurality of m memory cells, which do not belong to the n row and m column matrix 10 and are not writable, which constitutes a reference for the sense amplifiers 15.

The block 12 is composed of a latch matrix having n rows and m columns which allows the memory to be disabled during the typical management of the device in order to reduce the power consumption. Power reduction is very helpful for low power device design. The circuit 12 also allows the EPROM memory cells not to be damaged by assuring the reliability thereof. A latch matrix, per se, used for block 12 is of a type well known in the art and thus the details need not be described.

The block 11 is a reading logic block, also of a type known per se in the art, which supplies the addresses to the memory matrix 10 and to the latch matrix of the block 12. By means of a program counter it provides a complete scan of the memory matrix 10 and to copy it on the latch matrix of the block 12 both at the turning on of the device and in presence of a damage requiring such operation. During the test step, the aforementioned operation can be obtained by supplying a pulse from the outside to the pin D4. The block 11 also allows the reading of the columns of the memory matrix 10 by the sense amplifiers 15 through the signal enable, also called enread.

Figure 3:
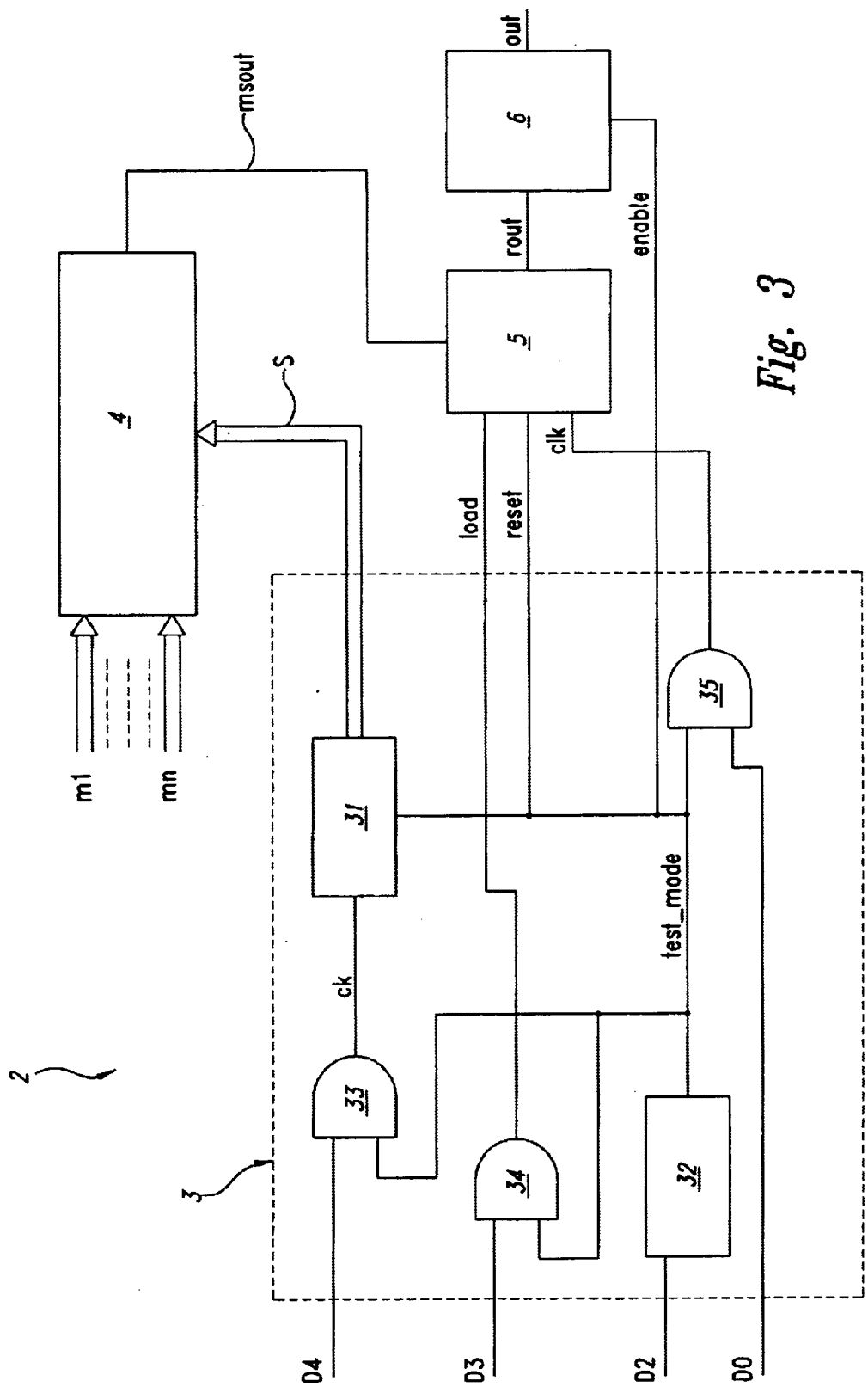
FIG. 3 is a more detailed block diagram of the verify apparatus according to invention which is shown in FIG. 1.

The circuit 2 is shown in more detail in FIG. 3 where it can be seen that the logic block 3 is formed by a counter 31, a comparator 32 and AND gates 33, 34, 35.

The apparatus described above allows to read each word of the memory matrix 10 stored in the block 1 by bringing the bits out of the apparatus in a serial way.

Figure 4A:
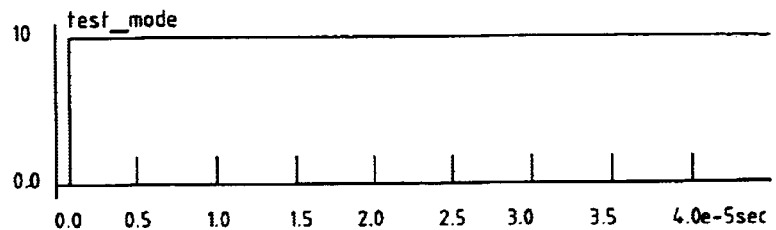
FIGS. 4a–4d are time diagrams of signals inside the verify apparatus of FIG. 1, which are derived from suitable outside signals to be supplied to the apparatus.

A voltage signal substantially of 10V is furnished at the pin D2 connected to the comparator 32 in order to enable the reading of the words of the memory matrix 10, which in this way brings high an output signal test-mode, as shown in FIG. 4a. The signal test-mode which coincides with the output signal enable of the block 3 enables the buffer 6 thereby allowing the connection of the register 5 to the output pin D1, see FIG. 1. Also, such signal test-mode is input at the AND gates 33, 34, 35 and, after that it is carried high, to enable the AND gates. In this way the signals at the pins D0, D2, D4 that are input at the AND gates 33, 34, 35 are transferred in output to the respective gates. The use of the comparator 32, the output of which is typically low, allows the pins dedicated to the apparatus 2 not to be utilized in the reading operation.

Figure 4B:
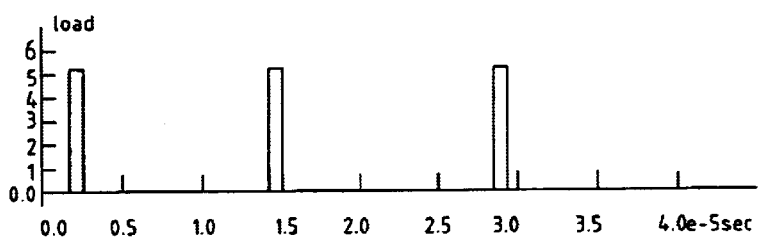
Figure 4C:
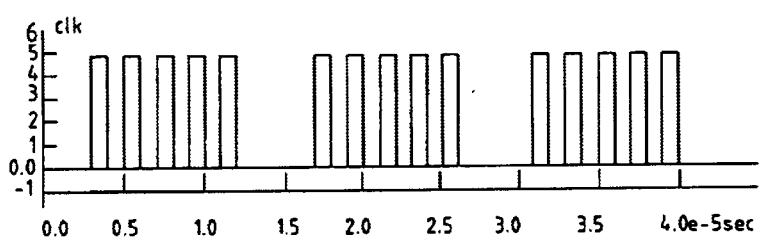
Figure 4D:
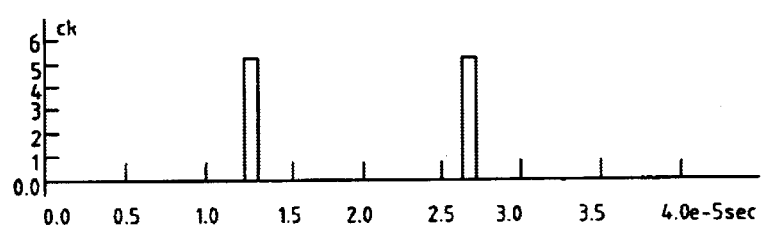

The following steps are typically used in succession for reading the bits of the memory matrix.

a. A pulse, substantially at 5V, at the pin D3 is provided to cause the signal load to enable the register 5 to load a memory word, as shown in FIG. 4b.

b. A number of m clock pulses, substantially at 5V, at the pin D0 causes the signal clk to enable the register 5 to shift the previously loaded bits, as shown in FIG. 4c;

c. A pulse, substantially at 5V, at the pin D4 causes that the signal ck of the AND gate 33 to enable the counter 31 to send an output signal S to the multiplexer 4 to allow the progression to the successive word, as shown in FIG. 4d.

d. For a complete test of all the memory, the circuit then repeats the steps a), b), c) for n times because n is the number of the words of the memory matrix 10.

Figure 4E:
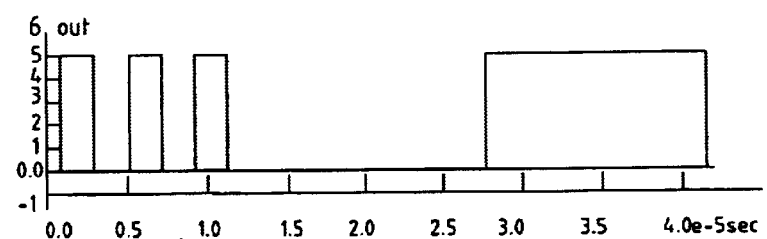
FIG. 4e is a time diagram of the output signal of the apparatus of FIG. 1.

In this way the apparatus will provide in output at the pin D1, with the signal out shown in FIG. 4e, the bits stored in the EPROM memory matrix 10 starting from the most significant bit, MSB, to the least significant bit, LSB.

The apparatus described above allows a maker or buyer to effectuate a test to quantify the data retention in the memory by means of procedures to seek the lowest threshold voltage of each single memory cell which may be measured by suitable instruments. According to one embodiment, the procedure used consists of a simulation of an aging of the device, by stressing it in temperature and by measuring the loss of the threshold voltage of each single memory cell after the thermal stress (called typically "bake"). During such test the lowest threshold voltage of the memory matrix, completely written, with the one exception of two words which are left virgin for storing the value obtained by the research therein, is sought. Then the bake is performed and the search of the lowest threshold voltage is repeated in order to compare the value obtained by this last search with the precedent one and in this way to value the voltage loss.

For measuring the change of the threshold voltage it is desired to change from outside the voltage furnished at the gates of the memory matrix and to control in the output bits at the pin D1 when the sense amplifier starts to fail reading; such voltage value corresponds to the threshold of the cell in object.

The following steps are typically used in succession in order to seek the lowest threshold voltage of the EPROM memory matrix 10.

1. A voltage pulse, substantially at 10V, is provided to the pin D2 connected to comparator 32, which in this way carries high an output signal test-mode, as shown in FIG. 4a, and it enables the AND gates 33, 34, 35 in presence of other input signals and also enables the buffer 6, as described previously.

2. A voltage at the gate of the memory matrix 10 through the input vg; voltage discrete values are provided substantially at pitches of 100 mV.

3. A voltage pulse, substantially at 10V, at the pin D4 in order to allow the values read by the sense amplifiers contained in the block 15 to be loaded into the latch matrix 12.

4. Wait for the time necessary for making the operation of step 3 (substantially n clock pulses) and then reset the counter 31 and the registers contained in the block 5 by carrying low, substantially at 0V, the voltage at the pin D2 and then carrying it high again, substantially at 10V.

5. Carrying out the reading steps from a to d, which were described previously, in order to carry the bits in serial way on the pin D1 so that they can be read.

6. Change the voltage applied at the gate of the memory matrix 10 through the pin vg by supplying a discrete voltage value, substantially of 100 mv, and repeating the steps from 2 to 5 up to achieve the lowest threshold value.

7. Execute an eight bit analog-digital conversion of the obtained value and write it inside the two virgin words of the memory matrix. Two rows of cells are left as virgin cells for this purpose, or some other location that has not been programmed with other data. The memory will thus carry out a test of itself, obtain the results of the test, and then store the results of the test in memory cells in its own matrix that have been selected for this purpose. If more test data is desired to be stored, additional memory cells may be set aside and used for this purpose.

Such apparatus 2 uses a very low pin number to effectuate the data retention test in the memories, particularly in the memories utilized in a device. Such number is independent from the sizes of the memory matrix and also the pins utilized are not dedicated to the aforementioned purpose but they can be utilized even for other purposes; in fact the use of the comparator 32 allows the pins to be used for the test or for the reading only when the voltage at the pin D2 is high. Taking the pin D2 is only one example of how to enter test mode. Of course, test mode may be entered by placing a selected sequence of signals on various pins or signals having a selected timing or value. There are many different ways to enter the test mode, any one of which is acceptable.

The apparatus 2 can be added to an any chip which contains a memory of any size without increasing the pin number and without modifying the same memory; this allows a considerable saving of the design time.

The apparatus has a very simple structure and it is of simple use. Also it is possible to carry out pre-conditioning tests on the assembled devices, by simulating the thermal effect of welding on a plate of a finished device so as to assure a high reliability degree of the memories.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus for verifying data retention in a non-volatile memory comprising:
   a multiplexer;
   a shift register, said multiplexer and said shift register being coupled so that the data of said non-volatile memory are input to said multiplexer, the output of which is input to said shift register;
   a logical circuitry coupled to the multiplexer and shift register which by suitable commands controls the transfer of data from said multiplexer to said shift register, the loading of data, and the shifting of output data in said shift register;
   means for applying a thermal stress to said nonvolatile memory;
   means for applying suitable commands to control the transfer of data from said multiplexer to said shift register, the loading of data and the shifting of output data in said shift register after thermal stress is applied to the nonvolatile memory; and
   comparing means for comparing data values prior to the thermal stress to data values after the thermal stress.

2. An apparatus according to claim 1, further including a buffer which receives the data from said shift register and which produces a measurable output signal.

3. An apparatus according to claim 2, wherein said buffer is controlled by said logical circuitry.

4. An apparatus according to claim 1, wherein said non-volatile memory comprises memory cells organized by rows and columns in a matrix structure.

5. An apparatus according to claim 4, wherein said matrix of cells of the non-volatile memory is an EPROM memory matrix.

6. An apparatus according to claim 4, wherein said non-volatile memory comprises a latch matrix for storing the data of the memory cell matrix.

7. An apparatus according to claim 6, wherein said multiplexer receives the data from said latch matrix.

8. An apparatus according to claim 4, wherein said non-volatile memory comprises sense amplifiers for reading data of said memory matrix.

9. An apparatus according to claim 4, wherein said non-volatile memory comprises a logical circuit which allows the addressing of the cells of the memory and latch matrixes and by suitable inputs enables copying of said memory matrix in said latch matrix.

10. An apparatus according to claim 1, wherein said at least one shift register is a parallel input and serial output register.

11. An apparatus for verifying data retention in a non-volatile memory comprising:
    a multiplexer;
    a shift register, said multiplexer and said shift register being coupled so that the data of said non-volatile memory are input to said multiplexer, the output of which is input to said shift register; and
    a logical circuitry coupled to the multiplexer and shift register which by suitable commands controls the transfer of data from said multiplexer to said shift register, the loading of data, and the shifting of output data in said shift register, said logical circuitry including AND logical gates, a voltage comparator and a counter which are controlled by voltage signals, said comparator being designated for enabling the AND gates with a high voltage pulse at the input thereof, said counter being designated for regulating said data transfer from said multiplexer to the at least one shift register, and a first one and a second one of said AND gates are employed respectively for data loading into and for output data shifting in said at least one shift register.

12. A system for verifying the data retention in non-volatile memories comprising:
    a non-volatile memory having memory cells organized by rows and columns in a matrix structure;
    a multiplexer;
    a shift register coupled to the multiplexer;
    a latch matrix, and a logical circuit which allows the addressing of said memory and control circuitry and which enables copying of said memory matrix in said latch matrix by use of suitable outside signals, and said multiplexer and said shift register are disposed so that data deriving from said latch matrix are input to said multiplexer, the output of which is in turn input to said shift register; and
    a logical circuitry which regulates the transfer of data from said multiplexer to said shift register, the loading of data and the shifting of the output data by suitable commands.

13. A system according to claim 12, wherein said apparatus comprises also a buffer which receives the data from said shift register and which produces a measurable output signal.

14. A system according to claim 13, wherein said buffer is controlled by said logical circuitry.

15. A system according to claim 12, wherein said non-volatile memory comprises sense amplifiers for reading data of said memory matrix.

16. A system according to claim 12, wherein said non-volatile memory matrix is an EPROM memory matrix.

17. A system according to claim 12, wherein said at least one shift register is a parallel input and serial output register.

18. A system according to claim 12, wherein said logical circuitry contains AND logical gates, a voltage comparator and a counter which are controlled by voltage signals, said comparator being designated for enabling the AND gates with a high voltage pulse at the input thereof, said counter being designated for regulating said data transfer from said multiplexer to the at least one shift register, and a first one and a second one of said AND gates are employed respectively for data loading and for output data shifting in said at least one shift register.

19. A method for reading sequences of data of a non-volatile memory and said data sequences being in input to a multiplexer, comprising:
    a) furnishing a high voltage signal to a logical circuitry;
    b) furnishing a first voltage pulse that is input to said logical circuitry for loading of data from said multiplexer to at least one shift register;

c) furnishing second voltage pulses that are input to said logical circuitry in suitable number in order to effectuate the shifting of the data in said at least one shift register;

d) furnishing a third voltage pulse that is input to said logical circuitry (so that the multiplexer furnishes a new sequence of data to said at least one shift register; and e) repeating the steps from b to d for a number of times which is equal to the number of the sequences of data deriving by said non-volatile memory to carry the data in a serial way in output from said at least one shift register so that they can be read.

20. A method for verifying the data retention of a non-volatile memory having memory cells organized by rows and columns in a matrix structure and a multiplexer receiving data sequences from said memory, comprising:

a) selecting at least two rows to store test data in said written memory cell matrix;

b) furnishing discrete low voltage values in input at the gates of the memory cells of said non-volatile memory matrix;

c) furnishing a first command to a logical circuitry for loading of data of a multiplexer into at least one shift register;

d) furnishing second commands, in a suitable number, to said logical circuitry in order to effectuate the data shifting in said at least one shift register;

e) furnishing third commands to said logical circuitry so that said multiplexer furnishes a new sequence of data to said at least one shift register;

f) repeating the steps from b to d for a number of times which is equal to the number of the sequences of data deriving by said non-volatile memory to carry the data in a serial way in output from said at least one shift register so that they can be read;

g) changing the voltage applied at the gates of said memory cells of said matrix of said non-volatile memory by furnishing a new low voltage discrete value equal to precedent one and then repeating the steps from b–t in order to achieve the lowest threshold voltage value of the memory matrix;

h) effectuating an analog-digital conversion of the achieved threshold voltage value and writing it inside the memory cell rows which were selected to store test data; and i) effectuating a thermal stress of said non-volatile memory and repeating the one or more of the prior steps from a to g in order to achieve a second threshold voltage value, comparing said new value with the precedent value and appraising the voltage loss.

21. A method according to claim 20, wherein prior to step 1 a high voltage signal is furnished in input to said logical circuitry to cause the circuiting to enter into memory cell test modality.

22. A method according to claim 21, wherein between step 1 and step 2 the following steps are applied:

a. furnishing a fourth command to said logical circuitry to allow copying of the data stored in said memory matrix into a latch matrix, said latch matrix being comprised in said non-volatile memory;

b. waiting for the necessary time for the step a) and then carrying low said voltage signal in input to said logical circuitry for resetting a counter of said logical circuitry; and c. resetting the at least one shift register and then carrying said voltage signal high again.

23. A method according to claim 20, wherein said commands are voltage pulses.

24. A method according to claim 20, wherein a buffer is provided which receives the data from said at least one shift register and which produces a measurable output signal.

25. A method according to claim 20, wherein said memory cell matrix is a EPROM memory matrix.

26. A method for reading sequences of data of a non-volatile memory, comprising:

furnishing a high voltage signal to a logical circuitry;

furnishing a first voltage pulse that is input to said logical circuitry for loading of data from a multiplexer to at least one shift register;

furnishing second voltage pulses that are input to said logical circuitry in suitable number in order to effectuate the shifting of the data in said at least one shift register;

furnishing a third voltage pulse that is input to said logical circuitry so that the multiplexer furnishes a new sequence of data to said at least one shift register;

applying a thermal stress to said nonvolatile memory; and repeating each of the furnishing steps again after having applied the thermal stress to said nonvolatile memory.

27. A method for testing the data retention of a nonvolatile memory comprising:

determining the memory cell within the memory array which has the lowest threshold voltage;

applying an increased temperature to the memory that places a thermal stress on the memory;

determining the lowest threshold voltage present in the memory after the thermal stress; and comparing the lowest threshold voltage prior to the thermal stress with the lowest threshold voltage after the thermal stress.

* * * * *